(12) United States Patent
Shinma

(10) Patent No.: US 6,563,207 B2
(45) Date of Patent: May 13, 2003

(54) SPLIT-MOLD AND METHOD FOR MANUFACTURING SEMICONDUCTOR DEVICE BY USING THE SAME

(75) Inventor: Yasuhiro Shinma, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/186,997

(22) Filed: Jul. 2, 2002

(65) Prior Publication Data

US 2002/0164391 A1 Nov. 7, 2002

Related U.S. Application Data

(63) Continuation of application No. 09/593,741, filed on Jun. 14, 2000, now Pat. No. 6,444,500.

(30) Foreign Application Priority Data

Dec. 24, 1999 (JP) .............................. 11-368469

(51) Int. Cl.[7] .......................... H01L 23/22; H01L 23/24
(52) U.S. Cl. ...................... 257/687; 257/787; 425/89; 425/127; 425/128; 425/116; 425/125; 264/272.17; 264/316
(58) Field of Search .............................. 257/687, 787; 425/89, 127, 128, 125, 116; 264/272.17, 316

(56) References Cited

U.S. PATENT DOCUMENTS

| | | | |
|---|---|---|---|
| 3,743,896 A | 7/1973 | Weiske et al. |
| 5,424,250 A | 6/1995 | Sawada |
| 5,733,802 A | 3/1998 | Inoue et al. |
| 5,923,959 A | 7/1999 | Mess |
| 6,114,189 A | 9/2000 | Chia et al. |
| 6,309,916 B1 | 10/2001 | Crowley et al. |
| 6,323,064 B1 | 11/2001 | Lee et al. |

FOREIGN PATENT DOCUMENTS

JP         10-79362         3/1998

Primary Examiner—David L. Talbott
Assistant Examiner—David A. Zarneke
(74) Attorney, Agent, or Firm—Staas & Halsey LLP

(57) ABSTRACT

A split-mold, which is used for manufacturing semiconductor devices by resin-encapsulating a substrate on which a plurality of semiconductor chips are formed, includes a first mold and a second mold. The second mold has a pressing surface that is provided with a mold release sheet. The second mold has a mold-release-sheet mechanism holding a mold release sheet outside the pressing surface of the second mold and applying tension to the mold release sheet.

6 Claims, 7 Drawing Sheets

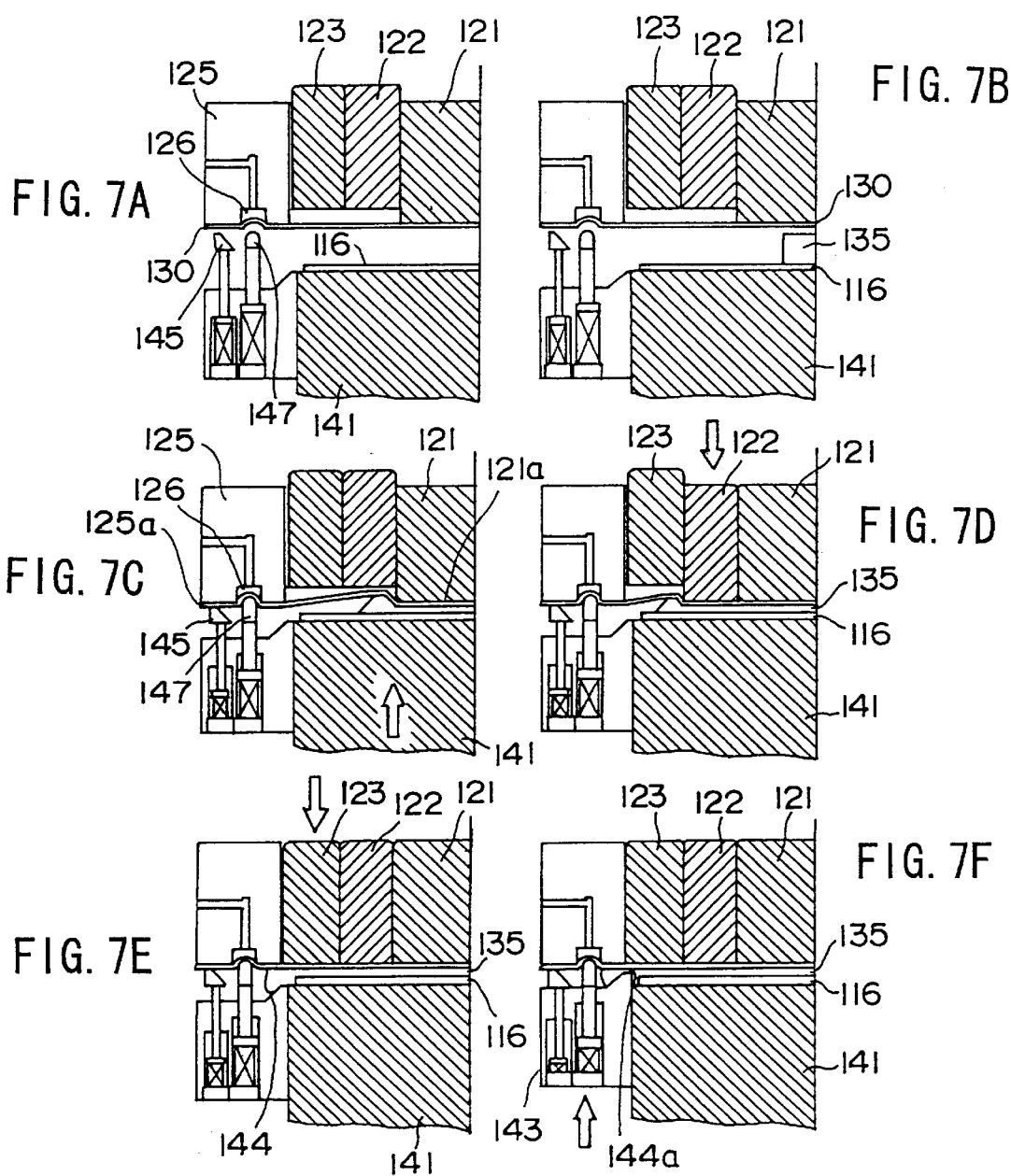

SPLIT-MOLD AND METHOD FOR MANUFACTURING SEMICONDUCTOR DEVICE BY USING THE SAME

This application is a Continuation of application Ser. No. 09/593,741, filed Jun. 14, 2000, U.S. Pat. No. 6,444,500.

BACKGROUND OF THE INVENTION

1. Field of the Invention

The present invention generally relates to methods for manufacturing semiconductor devices and split-molds used therein, and more particularly to a method for manufacturing Chip Size Package (CSP) type semiconductor devices and a split-mold used therein.

In recent years, with increasing demand for miniaturized electric equipment, a semiconductor device installed therein has also been required to have a smaller size (high density). In order to support this situation, the semiconductor device is made to have a size approximately the same as that of a semiconductor chip contained therein. Such a semiconductor device is referred to as the CSP type semiconductor device. The CSP type semiconductor device has a chip thereof encapsulated in resin so as to improve reliability while maintaining miniaturization.

The CSP type semiconductor device, on the other hand, needs to be manufactured with high productivity. Therefore it is very useful to improve productivity of a process for encapsulating the chip with the resin.

2. Description of the Related Art

FIGS. 1 through 4 show a conventional method for manufacturing such a CSP type semiconductor device and a conventional split-mold used in the method. The method includes a step for forming a resin layer serving to encapsulate a substrate on which a plurality of semiconductor chips are formed.

Specifically, FIG. 1 is a diagram schematically showing a split-mold 20 used for manufacturing the CSP type semiconductor device. As shown in this diagram, the split-mold 20 mainly includes a male mold 21 and a female mold 22 both of which are provided with heaters (not shown) serving to heat and melt encapsulating resin 35 that will be described later.

The male mold 21 is configured to be able to be moved up and down as shown by arrows Z1 and Z2 in FIG. 1. Further, the male mold 21 has a pressing surface 21a formed at the bottom thereof serving to apply a pressure to the encapsulating resin 35. The pressing surface 21a is a flatted surface.

The female mold 22, on the other hand, is configured to have a first female mold 23 that is shaped like a cylinder and a second female mold 24 that has an annular shape. The first female mold 23 is formed corresponding to and slightly larger than a substrate 16 in dimension. The substrate 16 is mounted on a pressing surface 25 of the first female mold 23. The second female mold 24 has a cavity surface 26 formed on an inner wall thereof, serving to provide space to accommodate the remainder of the encapsulating resin 35.

The second female mold 24 is configured to be approximately annular so as to surround the first female mold 23. Further, the second female mold 24 is able to be moved up and down with respect to the first female mold 23 along the arrows Z1 and Z2, that is, to approach to or separate from the pressing surface 21a of the male mold 21.

FIG. 1 also shows a state immediately prior to the beginning of a process for forming a resin layer. As shown in this diagram, in this state, the second female mold 24 is moved up with respect to the first female mold 23 in the direction Z2. By this movement, a space is formed between the first and second female molds 23, 24, serving to accommodate the substrate 16 on which a plurality of bumps (protruding electrodes) 12 are formed. In addition, in this state, the bumps 12 formed on the substrate 16 face toward the male mold 21.

Further, a mold release sheet 30 is attached to the pressing surface 21a, and the encapsulating resin 35 is placed on the bumps 12 of the substrate 16.

FIG. 2 is a top view, as seen from the male mold 21, showing a state of the encapsulating resin 35 being placed on the bumps 12. In this diagram, reference numeral 11 denotes a plurality of semiconductor chips before the substrate 16 is diced.

As previously described, when the process of mounting the substrate 16 and the process of providing the encapsulating resin 35 are completed, a process of forming a resin layer is performed. In the resin-layer forming process, the male mold 21 including the heater is moved down in the direction Z1 while heating the encapsulating resin 35, until the encapsulating resin 35 begins to melt.

The male mold 21 is thus moved down in the direction Z1 to contact the second female mold 24. Since the male mold 21 is provided with the mold release sheet 30 on the bottom thereof as previously described, when the male mold 21 contacts the second female mold 24, as shown in FIG. 3, the mold release sheet 30 is clamped therebetween. Further, the male mold 21 is provided with a sucking groove 29, which is connected to a vacuum source (not shown) and serves to suck a peripheral portion of the mold release sheet 30 so as to apply tension thereto. Such a configuration aims to prevent the mold release sheet 30 from generating wrinkles thereon. At this time, a cavity 28, which is surrounded by the pressing surfaces 21a, 25 and the cavity surface 26, is formed within the split-mold 20.

The male mold 21 is moved down while applying the pressure to the encapsulating resin 35 via the mold release sheet 30. Further, while applying the pressure to the encapsulating resin 35, the male mold 21 heats the encapsulating resin 35 so as to increase the temperature thereof to a value that can cause it to melt. Consequently, as shown in FIG. 3, the encapsulating resin 35 spreads out on the substrate 16.

When the male mold 21 contacts the second female mold 24, the mold release sheet 30 is clamped therebetween and is moved down together with them in the direction Z1. That is, the male mold 21 and the second female mold 24 are both moved down in the direction Z1.

The first female mold 23, on the other hand, is kept in a fixed state as shown in FIG. 4, and therefore a capacity of the cavity 28 is decreased while the male mold 21 and the second female mold 24 are both moved down. Thus, the encapsulating resin 35 within the cavity 28 is further pressed and thereby a resin layer is formed on the substrate 16.

With respect to the previously described manufacturing process, however, the pressing surface 21a of the male mold 21 is merely moved down and kept parallel with respect to the pressing surface 25 of the female mold 22. In other words, the male mold 21 is moved down toward the female mold 22 until a distance therebewteen approximately becomes equal to the height of a CSP type semiconductor to be manufactured. This downward movement applies a high molding pressure to the encapsulating resin 35 and causes it to spread out.

With respect to the process of forming the resin layer on the substrate 16, the molding pressure applied to a place (usually an approximately central portion of the substrate 16) where the encapsulating resin is placed is liable to become excessively high compared to that applied to a peripheral portion of the substrate. For this reason, the semiconductor chips formed on the central portion of the substrate 16 may be encapsulated in a higher molding pressure with the encapsulating resin 35. On the other hand, the semiconductor chips formed on the peripheral portion of the substrate 16 may be encapsulated in a lower molding pressure with encapsulating resin 35.

As a result, the conventional method for manufacturing the semiconductor device and the conventional split-mold used therein suffer from the following disadvantages.

One disadvantage in the conventional method is that the thus-formed resin layer may have no uniformity and for this reason the semiconductor chips after the substrate 16 is diced may vary in performance.

Another disadvantage in the conventional method is that, with the development of miniaturization and thinness of the semiconductor device, the semiconductor chips formed on the central portion may be damaged by an excessively high molding pressure, whereas the semiconductor chips formed on the peripheral portion may be incompletely encapsulated due to a lower molding pressure.

Still another disadvantage in the conventional split-mold 20 is that the mold release sheet 30 is attached to the male mold 21 by utilizing vacuum force that has limitations in holding the mold release sheet 30 and therefore it is possible that the mold release sheet 30 may be detached therefrom.

Still another disadvantage in the conventional split-mold 20 is that the mold release sheet 30 may generate wrinkles thereon due to deformation of the encapsulating resin. Such wrinkles must be certainly removed therefrom but this is difficult in the case of using only the vacuum force to suck the mold release sheet 30.

SUMMARY OF THE INVENTION

It is a general object of the present invention to provide a method of manufacturing a semiconductor device and a split-mold used in the method, in which the above disadvantages can be overcome.

Another and a more specific object of the present invention is to provide a method of manufacturing a semiconductor device and a split-mold used in the method, in which a resin layer can be formed using a uniform molding pressure and a mold release sheet used therein can be always kept in a tension state.

The above objects and other objects of the present invention are achieved by a method for manufacturing semiconductor devices, comprising the steps of preparing a split-mold including a first mold and a second mold, mounting a substrate, where a plurality of semiconductor chips are formed, on the first mold, forming a resin layer for encapsulating the substrate on the substrate such that a pressing surface of the first mold and a pressing surface of the second mold are brought close to each other so as to apply a molding pressure to the resin and make the resin spread out stepwise, and dicing the substrate into separate semiconductor device units.

The above objects and other objects of the present invention are achieved by a split-mold for manufacturing semiconductor devices by encapsulating a substrate, on which a plurality of semiconductor chips are formed, with resin. The split-mold comprises a first mold and a second mold, wherein the second mold is able to be moved relatively close to or away from a pressing surface of the first mold, and is provided with an inner portion and at least one outer movable portion that surrounds the inner portion and is able to be separately moved.

The above objects and other objects of the present invention are achieved by a split-mold for manufacturing semiconductor devices by encapsulating a substrate, on which a plurality of semiconductor chips are formed, with resin. The split-mold comprises a first mold and a second mold, wherein the second mold has a pressing surface that is provided with a mold release sheet, and the second mold has a mold-release-sheet mechanism holding a mold release sheet outside the pressing surface of the second mold and applying tension to the mold release sheet.

A better understanding of the features and advantages of the present invention will be obtained by reference to the following detailed description of the invention and accompanying drawings which set forth an illustrative embodiment in which the principles of the invention are utilized.

BRIEF DESCRIPTION OF THE DRAWINGS

FIGS. 7A through 7F are cross-sectional diagrams illustrating a method for manufacturing CSP type semiconductor devices by using the split-mold in FIG. 5.

DETAILED DESCRIPTION OF THE PREFERRED EMBODIMENT

With reference to the drawings, preferred embodiments of the present invention will be described below.

Figure 1:
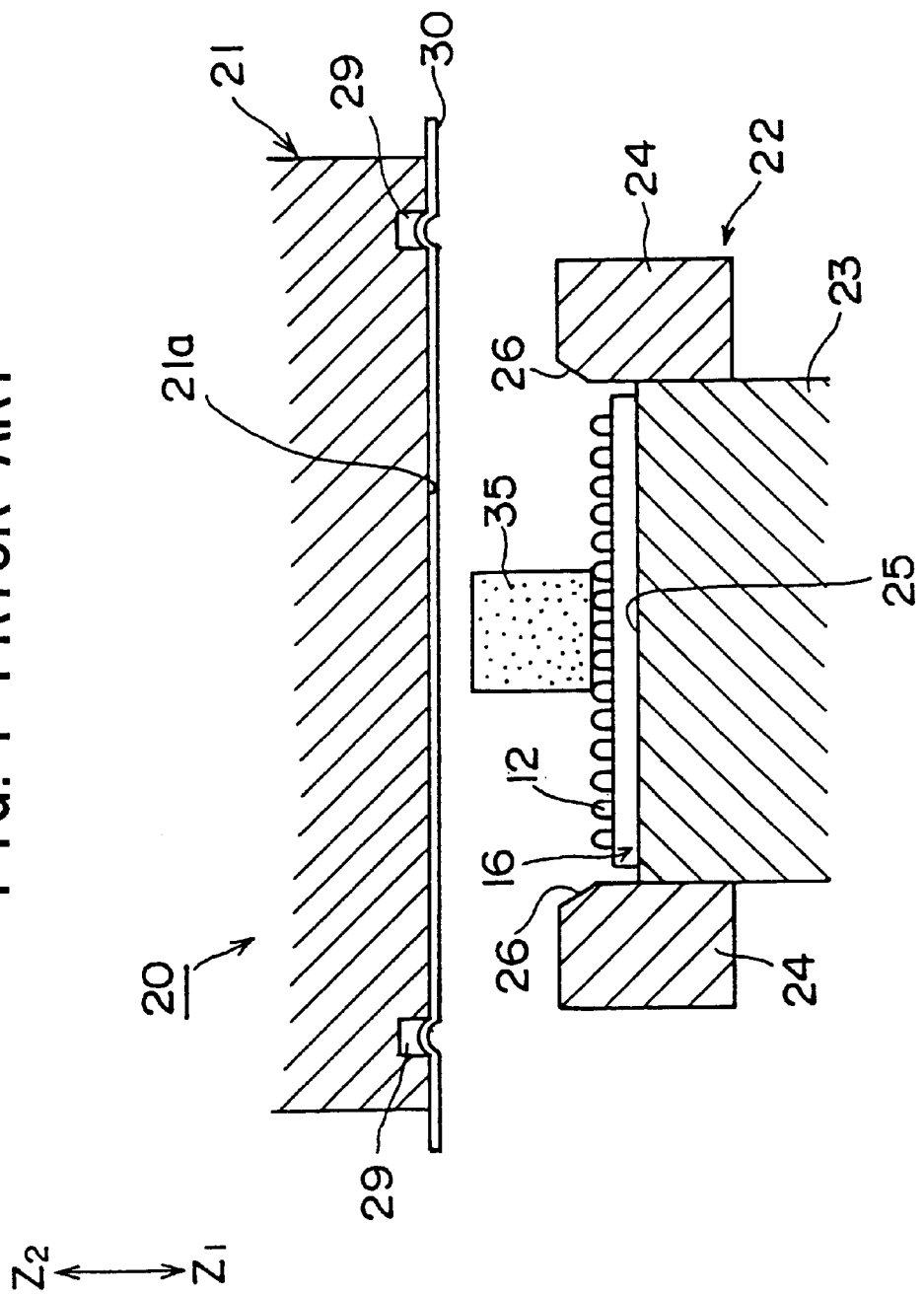
FIG. 1 is a cross-sectional diagram showing a schematic configuration of a conventional split mold used for manufacturing semiconductor devices.
Figure 2:
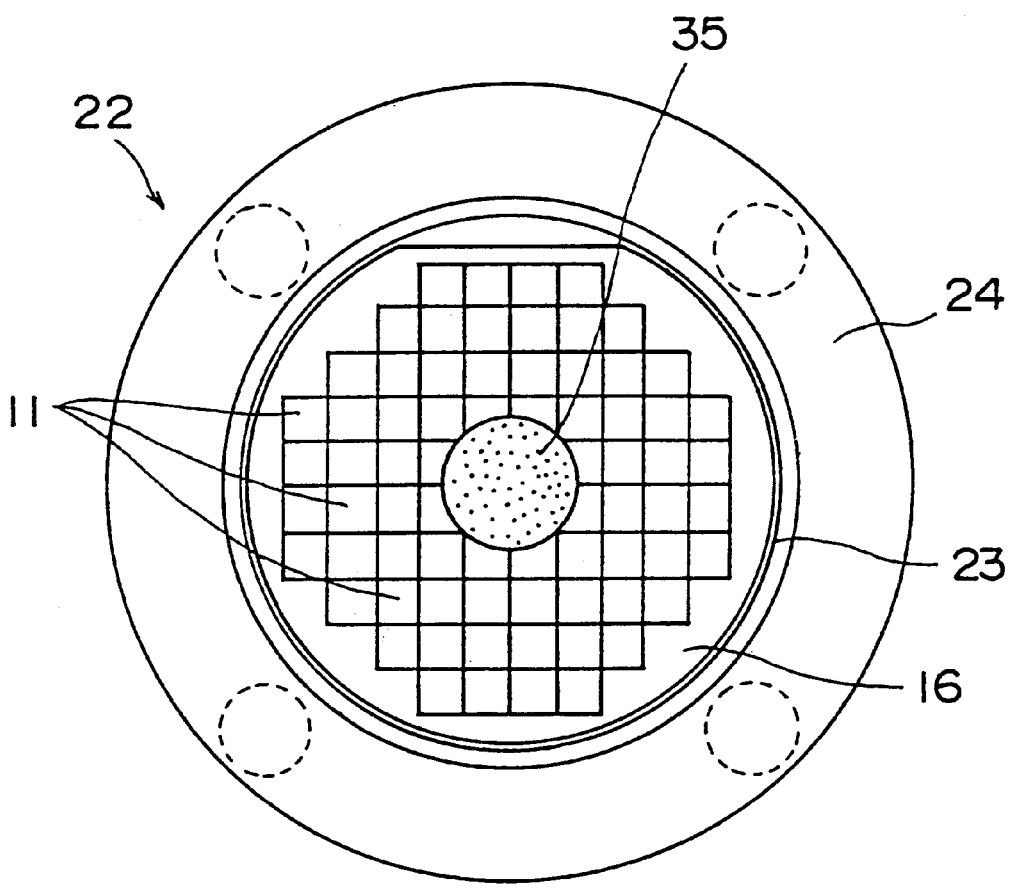
FIG. 2 is a top view, seen from a male mold of the split mold, showing a state in which encapsulating resin is placed on a female mold of the split mold in FIG. 1.
Figure 3:
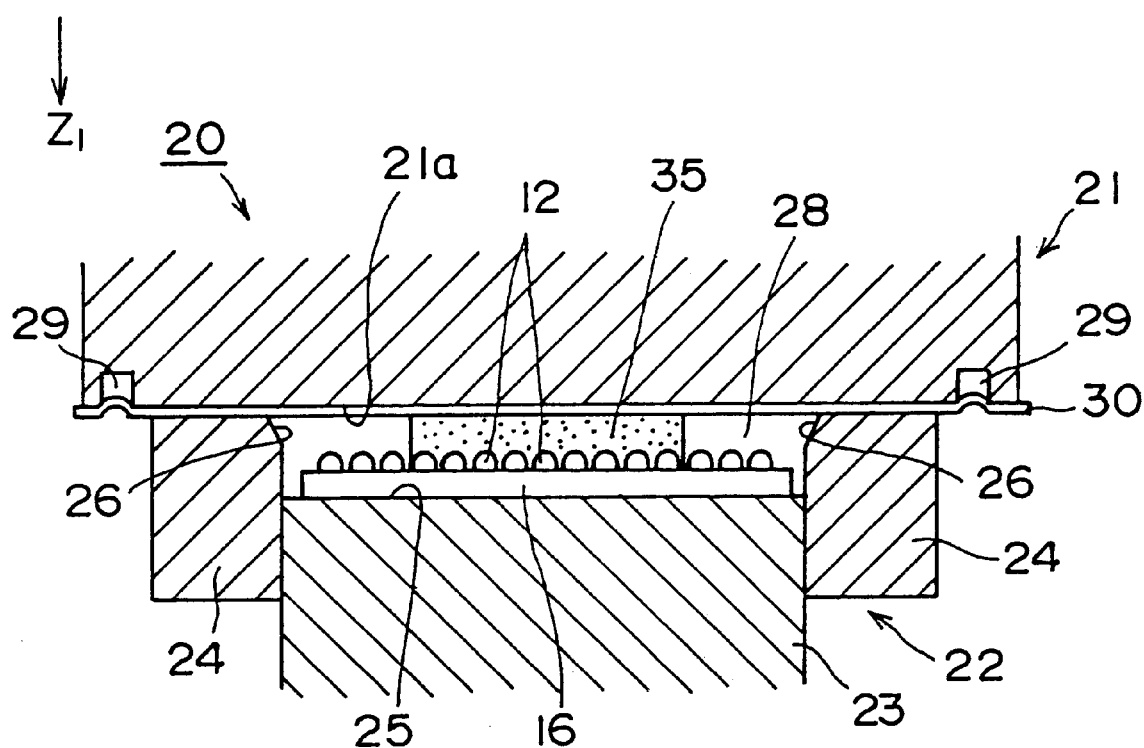
FIG. 3 is a cross-sectional diagram showing a state in which a mold release sheet is clamped between the male mold and a second female mold of the female mold of the split mold in FIG. 1.
Figure 4:
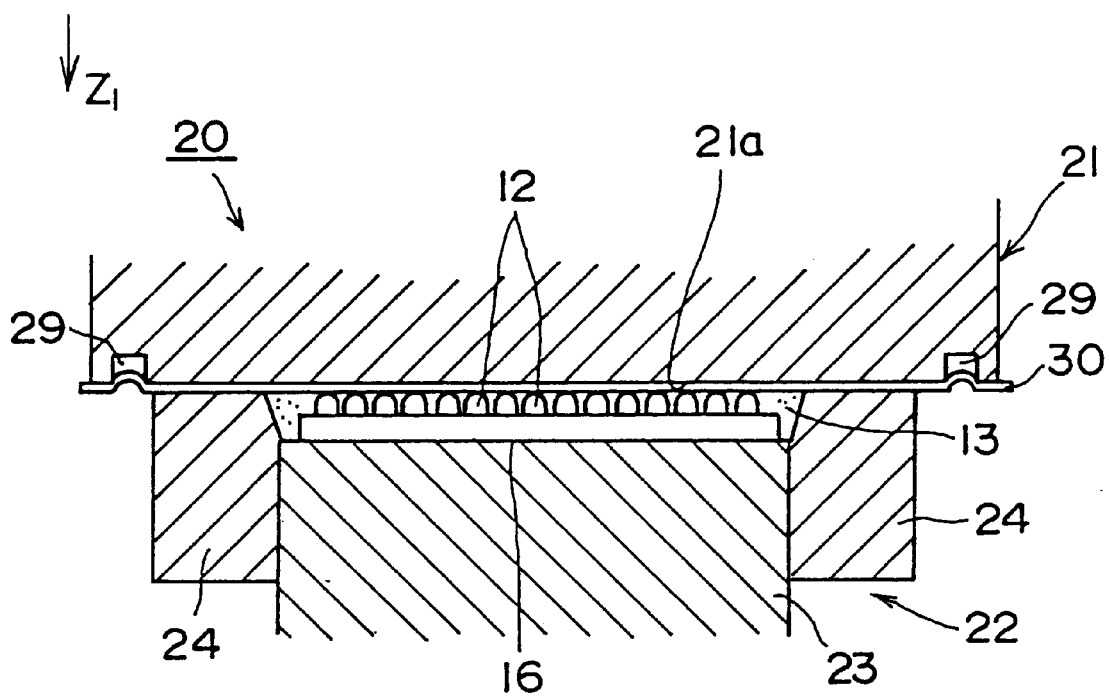
FIG. 4 is a cross-sectional diagram showing a state in which the male mold is further moved down from the state in FIG. 3.
Figure 5:
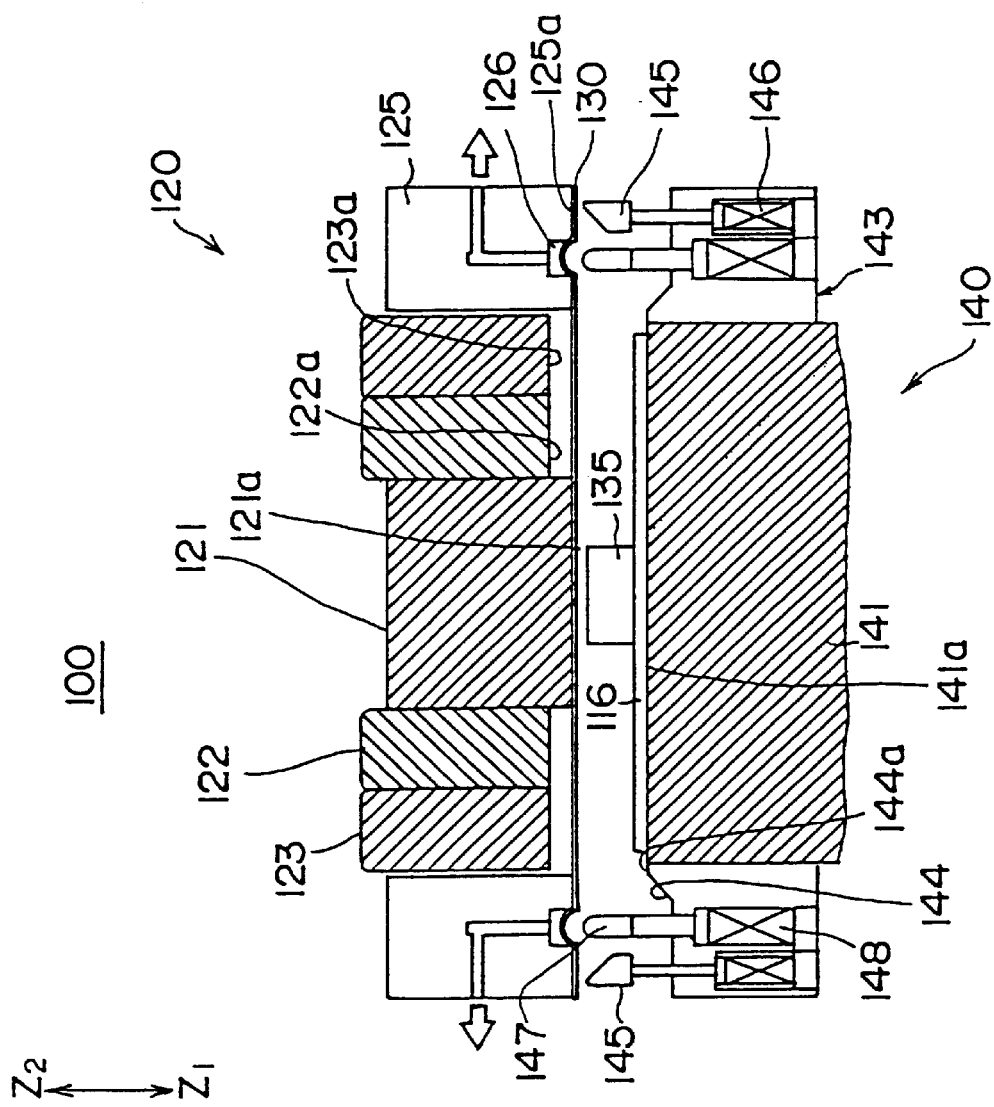
FIG. 5 is a cross-sectional diagram showing a schematic configuration of a split-mold of an embodiment according to the present invention.

FIG. 5 shows a schematic configuration of a split-mold 100 of an embodiment according to the present invention.

As shown in FIG. 5, the split-mold 100 includes a first mold (hereinafter referred to as female mold) 140 and a second mold (hereinafter referred to as male mold) 120.

The female mold 140 includes a female inner die 141 and a female outer die 143. The female inner die 141 has a pressing surface 141a formed on the top thereof and serving to apply a pressure (molding pressure) to resin 135. The female outer die 143 contacts and surrounds the female inner die 141. Further, the female mold 140 can be moved up and down in directions Z1 and Z2 by a driving source (not shown). Therefore, the male mold 120 may be seen to be relatively movable in a direction of approaching to or separating from the pressing surface 141a of the female mold 140.

Furthermore, the female outer die 143, with respect to the female inner die 141, can be separately moved up and down in the directions Z1 and Z2.

The female inner die 141 is shaped approximately like a cylinder and therefore the pressing surface 141a provided thereon is shaped approximately like a circle. On an approximately center portion of the pressing surface 141a, a substrate 116 is provided where a plurality of semiconductor chips are formed. On an approximately center portion of the substrate 116, encapsulating resin 135 is placed.

The female outer die 143 is provided with a mold-release-sheet holding mechanism for holding and applying tension to a mold release sheet 130 to be described later, and by means of this mechanism, the mold release sheet 130 can be prevented from generating wrinkles thereon.

The mold-release-sheet holding mechanism includes a ring-shaped pressing wall (hereinafter referred to as pretensioner) 147 and a ring-shaped contacting wall (hereinafter referred to as clamper) 145. The pretensioner 147 is configured to be able to move in a ring-shaped sucking groove 126 formed on the male mold 120 so as to apply tension to the mold release sheet 130. The damper 145 is positioned outside the pretensioner 147 so as to clamp the mold release sheet 130 to the male mold 120. The pretensioner 147 has a base portion thereof supported by a biasing mechanism 148, which biases the pretensioner 147 in the direction Z2 by, for example, a spring force, an air pressure, an oil pressure, a magnetic force or the like. Thus, a necessary pressing force for removing the wrinkles from the mold release sheet 30 can be obtained by adjusting a pressure generated in the biasing mechanism. Similarly, the damper 145 has a base portion thereof supported by a biasing mechanism 146. By adjusting a pressure generated in the biasing mechanism 146, a necessary clamping force for positively clamping the mold release sheet 130 can be obtained.

Further, the female outer die 143 is provided with a ring-shaped taper portion 144 inclining toward the biasing mechanism 148 as shown in FIG. 5. The taper portion 144 serves as a receiving portion for receiving the resin 135 that is squeezed outside during the forming of the resin layer. In addition, the taper portion 144 has a top portion 144a used for trimming barriers (the remainder resin) off the substrate 16 during the final step of a resin-layer forming process.

Next, a description is given below of the male mold 120 by referring to FIGS. 5 and 6.

As shown in the diagrams, the male mold 120 includes a male inner die 121, a first male outer movable portion 122, a second male outer movable portion 123, and a male outer die 125.

Specifically, the male inner die 121 is positioned in an approximately central portion of the male mold 120. The first and second male outer movable portions 122 and 123 are provided on a peripheral portion of the male mold 120. The male outer die 125 is further positioned outside the second male outer movable portion 123.

Figure 6:
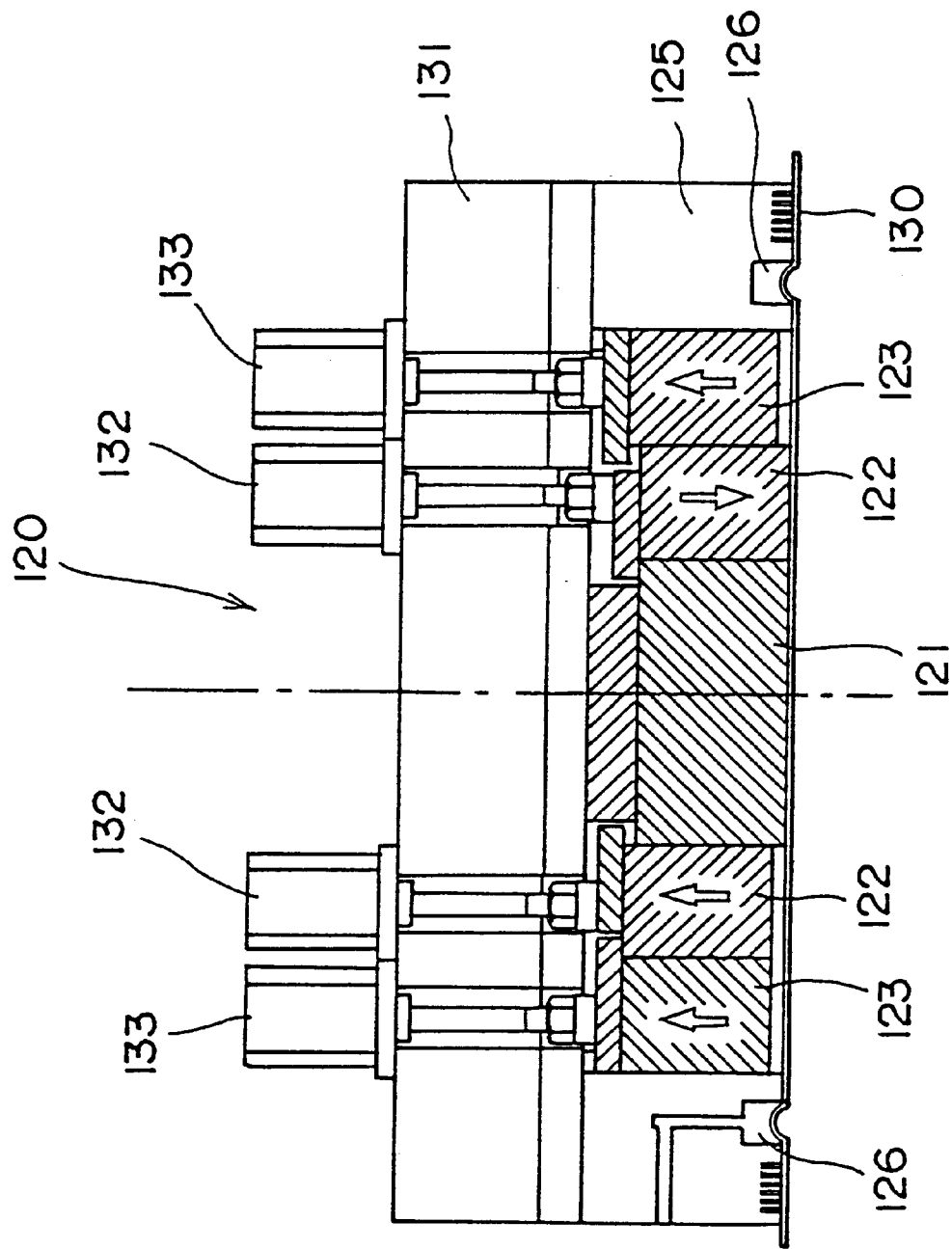
FIG. 6 is a cross-sectional diagram showing a schematic configuration of a male mold of the split-mold in FIG. 5.

In this embodiment, the male mold 120 is kept in a fixed state and the male inner die 121 is fixed via a housing 131 as shown in FIG. 6.

Although unmovable, the male inner die can be seen to move relatively in a vertical direction with respect to the pressing surface 141a of the female mold 140 because the female mold 140 can be moved in the directions Z1 and Z2 as previously described. Further, the male inner die 121 is shaped approximately like a cylinder and is provided with an approximately circlular pressing surface 121a on the bottom thereof as shown in FIG. 6. The male inner die 121 and the female inner die 141 are configured to be approximately coaxial.

The first male outer movable portion 122 contacts and surrounds the male inner die 121 such that, as shown in FIG. 6, the first male outer movable portion 122 is connected to an oil cylinder 132 and is able to separately move up and down with respect to the male inner die 121 and the second male outer movable portion 123.

The second male outer movable portion 123 contacts and surrounds the first male outer movable portion 122 such that, as shown in FIG. 6, the second male outer movable portion 123 is connected to an oil cylinder 133 and is able to separately move up and down with respect to the male inner die 121 and the first male outer movable portion 122.

The first male outer movable portion 122 is provided with an annular pressing surface 122a and the second male outer movable portion 123 is provided with an annular pressing surface 123a as shown in FIG. 5. In addition, when positioned in a co-planar relationship to form one pressing surface, the pressing surface 121a of the male inner die 121 and the pressing surfaces 122a and 123a substantially form one circular surface.

The second male outer movable portion 123 is surrounded by the male outer die 125. As shown in FIG. 6, the male outer die 125 is fixed by the housing 131 of the male mold 120 so as to be able to move up and down with the male inner die 121.

In addition, FIG. 6 shows a schematic configuration of the male mold 120 of the split-mold 100, including right and left parts divided by the center line of the male inner die 121. The right and left parts show that the first male outer movable portion 122 and the second male outer movable portion 123 are positioned in two different states. Specifically, on the left side, neither of the first male outer movable portion 122 nor the second male outer movable portion 123 is moved down and they are positioned in an initial state of being higher than the male inner die 121. On the right side, in contrast, the first male outer movable portion 122 is separately moved down to a position co-planar with that of the male inner die 121, and the second male outer movable portion 123 is not moved down and is positioned higher than the male inner die 121.

The male outer die 125 has a bottom surface 125a that is formed approximately co-planar with the pressing surface 121a of the male inner die 121. The bottom surface 125a is ring-shaped as well and is provided with the ring-shaped sucking groove (hereinafter referred to as circumferential groove) 126 thereon. The circumferential groove 126 is connected to a vacuum source (not shown) and the inside thereof is in a negative pressure state.

In addition, in the directions Z1 and Z2, the previously described pretensioner 147 of the female mold 140 is arranged in a position corresponding to the circumferential groove 126, the damper 145 is arranged in a position of being able to contact the bottom surface 125a.

The mold release sheet 130 is provided on the bottom surface of the male mold 120 when the split-mold 100 is in use. At this time, the mold release sheet 130 is arranged to contact the pressing surface 121a such that it is sucked by the circumferential groove 126 and attached to the bottom surface 125a. The mold release sheet 130 may be a sheet of paper made up of, for example, polymide, vinyl chloride, PC, PET, raw resolvability resin, synthetic paper or the like, a sheet of metal paper, or combination thereof.

The above-mentioned encapsulating resin 135 may be made up of, for example, polymide, epoxy (thermoplastic resin such as PPS, PEEK, PES, thermoresistance liquid resin), or the like. In this embodiment, since the split-mold 100 has a circular pressing surface, it is desirable that the resin 135 be cylinder-shaped as well.

FIGS. 7A through 7F show the steps of a process of manufacturing the CSP type semiconductor devices according to the present invention by using the thus-configured split-mold 100. In addition, FIGS. 7A through 7F only show one side (left side) of each step of the process because the right side and the left side are identical in operation.

FIG. 7A shows a state in which a mold-release-sheet attaching step for attaching the mold release sheet 130 to the pressing surface 121a of the male inner die 121 and a substrate mounting step for mounting the substrate 116 where a plurality of semiconductor chips are formed on the pressing surface 141a of the female inner die 141 have been completed. At the mold-release-sheet attaching step, the peripheral portion of the mold release sheet 130 is sucked by the circumferential groove 126 and thereby is kept under the male mold 120 in a state of contacting the pressing surface 121a of the male inner die 121.

In addition, at this time, a positional relationship among the male inner die 121 and the first and second male outer movable portions 122 and 123 is such that the first and second male outer movable portions 122 and 123 are moved up in the direction Z2 with respect to the male inner die 121 so as to form a space.

FIG. 7B shows a resin placing step for placing the encapsulating resin 135 on the substrate 116. As shown in this diagram, the encapsulating resin 135 is placed on a place that is approximately the center of the substrate 116. The place approximately corresponds to the center of the pressing surface 121a of the male inner die 121.

FIGS. 7C through 7F are diagrams illustrating that the resin layer is formed on the substrate 116 while the resin 135 is pressed to spread out in sequential steps.

As shown in FIG. 7C, the female mold 140 is moved up with respect to the male mold 120. At this time, the damper 145 contacts the bottom surface 125a of the male outer die 125 and begins to clamp the peripheral portion of the mold release sheet 130. After that, the pretensioner 147 is in a state of entering the circumferential groove 126. The mold release sheet 130 has the peripheral portion thereof clamped by the damper 145 and has an portion inside the peripheral portion pressed into the circumferential groove 126 by the pertensioner 147. Thus, with the upward movement of the female mold 140, the mold release sheet is certainly clamped by the damper 145 and is further provided with a strong tension by the pretensioner 147.

As a result, the mold release sheet 130 is prevented from separating from the male mold 120 and generating wrinkles thereon.

Further, FIG. 7C shows a state in which the pressing surface 121a of the male inner die 121 applies a molding pressure to the resin 135. At this time, the pressing surface 121a of the male inner die 121 properly presses the resin 135. Both the first male outer movable portion 122 and second male outer movable portion 123 are moved up in the direction Z2 with respect to the male inner die 121 so as to ensure a space for receiving the resin 135. Thus, the resin 135 squeezed out of the pressing surface 121a radially flows from the center position into the space.

Unlike the prior art where no space for receiving resin is provided while the resin is pressed, in the present invention, a molding pressure which is applied to the central portion of the substrate 116 is mitigated by the space so as to avoid becoming excessively high. As a result, the molding pressure is uniform.

Then, the female mold 140 is moved up toward the pressing surface 121a of the male inner die 121 until a distance between the female mold 140 and the pressing surface 121a is equal to a height of the CSP type semiconductor device to be manufactured. After that, the female mold 140 is stopped.

FIG. 7D shows a state in which the first male outer movable portion 122 is moved down to the same position where the male inner die 121 is stopped. At this time, since the pressing surface 121a applies a pressure to the resin 135, the resin 135 flows into the space formed under the second male outer movable portion 123. The first male outer movable portion 122 is stopped when the pressing surface 122a thereof is moved to the same position where the pressing surface 121a of the male inner die 121 is stopped. Thus, the pressing surface 122a and the pressing surface 121a substantially form one uniform surface.

FIG. 7E shows a state in which the second male outer movable portion 123 is also moved down to the same position where the male inner die 121 is stopped. At this time, since the pressing surface 123a applies a pressure to the resin 135, the resin 135 is further squeezed outside. The remaining resin 135 is piled up in the taper portion 144 of the female outer die 143.

The second male outer movable portion 123 is also stopped when the pressing surface 123a thereof is moved to the same co-planar position where the pressing surface 121a of the male inner die 121 and the pressing surface 122a of the first male outer movable portion 122 are stopped. Thus, the pressing surface 123a, the pressing surface 122a and the pressing surface 121a substantially form one uniform co-planar surface. As previously described, the thus-pressed resin 135 flows stepwise from the central portion to the peripheral portion in a radial direction without generating excessive molding pressure on any portion of the substrate 116.

As a result, the resin layer can be formed in a uniform way by applying uniform molding pressure to all of portions of the substrate 116.

Further, during the above described resin-layer forming step, by means of the damper 145 and the pretensioner 147, the strong tension is applied to the mold release sheet 30 and thereby no wrinkle is generated thereon. As a result, the resin layer formed on the substrate 116 becomes uniform.

FIG. 7F shows that the female outer die 143 is moved up and thereby the taper portion 144 is projected. In this state, a trimming step is performed for trimming the remainder resin 135 squeezed out from between the female inner die 141 and the male mold 120 off the substrate 116. Finally, the female inner die 140 is further moved up so as to maintain the resin 135 under a proper molding pressure. Thus, the resin encapsulation of the substrate 116 is completed.

The above description is provided in order to enable any person skilled in the art to make and use the invention and sets forth the best mode contemplated by the inventors for carrying out their invention.

The present application is based on Japanese priority application No. 11-368469 filed on Dec. 24, 1999, the entire contents of which are hereby incorporated by reference.

It should be understood that various alternatives to the embodiments of the invention described herein may be employed in practicing the invention.

For example, in this embodiment, the male mold 120 is fixed but the female mold 140 is moved up. It goes without saying that the split-mold 100 of the present invention can be configured such that the male mold 120 is moved down and the female mold 140 is fixed.

Further, in this embodiment, the male inner die 121 is fixed in the housing 131, but the present invention is also applicable to a configuration wherein the male inner die 121 itself can be moved up and down with respect to the housing 131. In such a configuration, the present invention can obtain the same effects by properly moving up and down the male inner die 121 and the first and second male outer movable portions 122 and 123 even though the housing 131 of the male mold 120 and the female mold 140. are fixed.

Furthermore, in this embodiment, the pressing surfaces are circular and annular, respectively. It goes without saying that the pressing surfaces can be shaped like other forms. Similarly, the sucking groove (circumferential groove) 126, the contacting wall (clamper) 145, and the pressing wall (pretensioner) 147 are not limited to being ring-shaped.

It is intended that the following claims define the scope of the invention and that structures and methods within the scope of these claims and their equivalents be covered thereby.

What is claimed is:

1. A split-mold for manufacturing semiconductor devices by encapsulating a substrate, on which a plurality of semiconductor chips are formed, with resin, said split-mold comprising:

a first mold; and a second mold;

wherein said second mold relatively approaches to or separates from a pressing surface of said first mold, and is provided with an inner portion and at least one outer movable portion that surrounds said inner portion and is able to be separately moved with respect to said inner portion.

2. The split-mold as claimed in claim 1, wherein:

said inner portion includes a circle-shaped pressing surface; and said at least one outer movable portion includes a ring-shaped pressing surface.

3. The split-mold as claimed in claim 2, wherein said second mold includes a mold-release-sheet mechanism holding a mold release sheet outside said pressing surface of said second mold and applying tension to said mold release sheet.

4. The split-mold as claimed in claim 3, wherein said mold-release-sheet mechanism includes:

a sucking groove formed outside said pressing surface of said first mold and serving to suck said mold release sheet attached to said pressing surface of the said second mold;

a pressing wall moving into or retreating from said sucking groove and serving to apply tension to said mold release sheet; and a contacting wall formed outside said pressing wall and serving to clamp said mold release sheet to said second mold.

5. A split-mold for manufacturing semiconductor devices by encapsulating a substrate, on which a plurality of semiconductor chips are formed, with resin, said split-mold comprising:

a first mold; and a second mold; wherein:

said second mold has a pressing surface that is provided with a mold release sheet; and said second mold has a mold-release-sheet mechanism holding a mold release sheet outside said pressing surface of said second mold and applying tension to said mold release sheet.

6. The split-mold as claimed in claim 5, wherein said mold-release-sheet mechanism includes:

a sucking groove formed outside said pressing surface of said first mold and serving to suck said mold release sheet attached to said pressing surface of said second mold;

a pressing wall moving into or retreating from said sucking groove and serving to apply tension to said mold release sheet; and a contacting wall formed outside said pressing wall and serving to clamp said mold release sheet together with said second mold.

* * * * *